United States Patent
Tseng et al.

(10) Patent No.: US 12,048,228 B2
(45) Date of Patent: Jul. 23, 2024

(54) IMAGE CAPTURE DEVICE

(71) Applicant: Gingy Technology Inc., Hsinchu (TW)

(72) Inventors: Chung Hao Tseng, Hsinchu (TW); Mon-Nan Ho, Hsinchu (TW)

(73) Assignee: Gingy Technology Inc., Hsinchu (TW)

( * ) Notice: Subject to any disclaimer, the term of this patent is extended or adjusted under 35 U.S.C. 154(b) by 418 days.

(21) Appl. No.: 17/337,372

(22) Filed: Jun. 2, 2021

(65) Prior Publication Data
US 2022/0359624 A1   Nov. 10, 2022

(30) Foreign Application Priority Data

May 6, 2021 (TW) ................................. 110116389

(51) Int. Cl.
| | | |
|---|---|---|
| *H10K 59/65* | (2023.01) | |
| *H10K 50/86* | (2023.01) | |
| *H10K 59/121* | (2023.01) | |
| *H10K 59/35* | (2023.01) | |
| *G06V 40/13* | (2022.01) | |

(52) U.S. Cl.
CPC ........... *H10K 59/65* (2023.02); *H10K 50/865* (2023.02); *H10K 59/121* (2023.02); *H10K 59/352* (2023.02); *G06V 40/1318* (2022.01); *G06V 40/1324* (2022.01)

(58) Field of Classification Search
CPC .... H10K 59/65; H10K 50/865; H10K 59/121; H10K 59/353; H10K 59/352; H10K 59/8792; G06V 40/1318; G06V 40/1324
See application file for complete search history.

(56) References Cited

U.S. PATENT DOCUMENTS

| | | |
|---|---|---|
| 2016/0266695 A1 | 9/2016 | Bae et al. |
| 2021/0004554 A1 | 1/2021 | Kobayashi et al. |
| 2021/0074780 A1* | 3/2021 | Woo ........................ H10K 59/65 |
| 2022/0285461 A1* | 9/2022 | Hatsumi ................ H10K 59/40 |

FOREIGN PATENT DOCUMENTS

| | | |
|---|---|---|
| CN | 104318199 | 3/2020 |
| CN | 111488830 | 8/2020 |
| CN | 111801679 | 10/2020 |

OTHER PUBLICATIONS

"Office Action of Taiwan Counterpart Application", issued on May 30, 2022, p. 1-p. 8.

* cited by examiner

*Primary Examiner* — Adam R. Giesy
(74) *Attorney, Agent, or Firm* — JCIPRNET (57) ABSTRACT

An image capture device including an image capture module and a display panel is provided. The display panel is disposed on the image capture module and includes multiple pixels. Each of the pixels includes a first light-emitting region and a second light-emitting region. The first light-emitting region emits a first light beam. The first light beam is transmitted to the image capture module through a region outside the first light-emitting region. In each of the pixels, a total area of the first light-emitting region is smaller than a total area of the second light-emitting region.

8 Claims, 10 Drawing Sheets

FIG. 10

IMAGE CAPTURE DEVICE

CROSS-REFERENCE TO RELATED APPLICATION

This application claims the priority benefit of Taiwan application serial no. 110116389, filed on May 6, 2021. The entirety of the above-mentioned patent application is hereby incorporated by reference herein and made a part of this specification.

BACKGROUND

Technical Field

The disclosure relates to an electronic device, and more particularly, to an image capture device.

Description of Related Art

Organic light-emitting diode display panels currently in the market may be mainly divided into two major mainstreams such as active matrix organic light-emitting diode display panels and passive matrix organic light-emitting diode display panels. Subject to the driving principle of the passive matrix organic light-emitting diode display panel, when the panel is increased in size, in order to keep more pixels at the same brightness, the driving current of the passive matrix organic light-emitting diode display panel will be greatly increased, and thus shorten the lifetime of the pixels. Therefore, the size of the passive matrix organic light-emitting diode display panel is mostly in the middle and small sizes, so as to maintain the display quality while taking the product life into account. However, the application and resolution of the passive matrix organic light-emitting diode display panels are therefore limited.

SUMMARY

The disclosure provides an image capture device, which has higher resolution than a conventional passive matrix organic light-emitting diode display panel.

An embodiment of the disclosure provides an image capture device, which includes an image capture module and a display panel. The display panel is disposed on the image capture module, and includes multiple pixels. Each of the pixels includes a first light-emitting region and a second light-emitting region. The first light-emitting region emits a first light beam. The first light beam is transmitted to the image capture module through a region outside the first light-emitting region. In each of the pixels, a total area of the first light-emitting region is smaller than a total area of the second light-emitting region.

In an embodiment of the disclosure, the image capture module includes a sensor and an optical system. The optical system is disposed between the sensor and the display panel.

In an embodiment of the disclosure, the optical system includes an optical lens or a micro lens matrix.

In an embodiment of the disclosure, the first light-emitting region includes a first upper electrode, a first light-emitting layer, and a first lower electrode. The first light-emitting layer is located between the first upper electrode and the first lower electrode. The first upper electrode allows the first light beam to pass through, and the first lower electrode shields the first light beam.

In an embodiment of the disclosure, the first lower electrode includes a non-transparent conductive electrode, or the first lower electrode includes a transparent conductive electrode and a stacked layer of a light-shielding layer.

In an embodiment of the disclosure, the second light-emitting region does not emit a light beam when the first light-emitting region emits the first light beam.

In an embodiment of the disclosure, the second light-emitting region emits a second light beam when the first light-emitting region emits the first light beam.

In an embodiment of the disclosure, the second light beam and the first light beam have different wavelengths, and the image capture module includes a filter. The filter allows the first light beam to pass through and filters the second light beam.

In an embodiment of the disclosure, the second light-emitting region includes a second upper electrode, a second light-emitting layer, and a second lower electrode. The second light-emitting layer is located between the second upper electrode and the second lower electrode. Both the second upper electrode and the second lower electrode allow the second light beam to pass through, and at least one of the second upper electrode and the second lower electrode shields the first light beam.

In an embodiment of the disclosure, the second light beam and the first light beam have the same wavelengths, and the second light-emitting region includes the second upper electrode, the second light-emitting layer, and the second lower electrode. The second light-emitting layer is located between the second upper electrode and the second lower electrode. The second upper electrode allows the first light beam and the second light beam to pass through, and the second lower electrode shields the first light beam and the second light beam.

Based on the above, in the embodiment of the disclosure, since one single pixel is divided into multiple light-emitting regions, the image capture device has higher resolution than the conventional passive matrix organic light emitting diode display panel. In addition, by making the total area of the first light-emitting region (such as an image capture light-emitting region) in each of the pixels smaller than the total area of the second light-emitting region (such a display light-emitting region), it is beneficial to maintain an image capturing quality of the image capture module.

In order for the aforementioned features and advantages of the disclosure to be more comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Directional terms used herein, such as "upper," "lower," "front," "rear," "left" and "right," merely refer to directions in the accompanying drawings. Therefore, the directional terms are used to illustrate rather than limit the disclosure.

In the accompanying drawings, each drawing depicts general features of methods, structures, or materials used in specific embodiments. However, these drawings should not be construed as defining or limiting the scope or nature covered by these embodiments. For example, for clarity, the relative size, thickness and position of each film layer, region, or structure may be reduced or enlarged.

In the following embodiments, the same or similar elements will be denoted by the same or similar reference numerals, and repeated description thereof will be omitted. In addition, the features in different embodiments can be combined without conflict, and all simple equivalent changes and modifications made in accordance with the present specification or claims still fall within the scope of the disclosure.

Terms such as "first" and "second" mentioned in the present specification or claims are only used to name different elements or distinguish different embodiments or ranges, and are not used to limit an upper or lower limit of the number of elements, nor to limit the manufacturing order or disposition order of the elements. In addition, the disposition of one element/film layer on (or above) another element/film layer can encompass the element/film layer being directly disposed on (or above) the other element/film layer, with the two elements/film layers being in direct contact with each other, and the element/film layer being indirectly disposed on (or above) the other element/film layer, with one or more elements/film layers located between the two elements/film layers.

Figure 1:
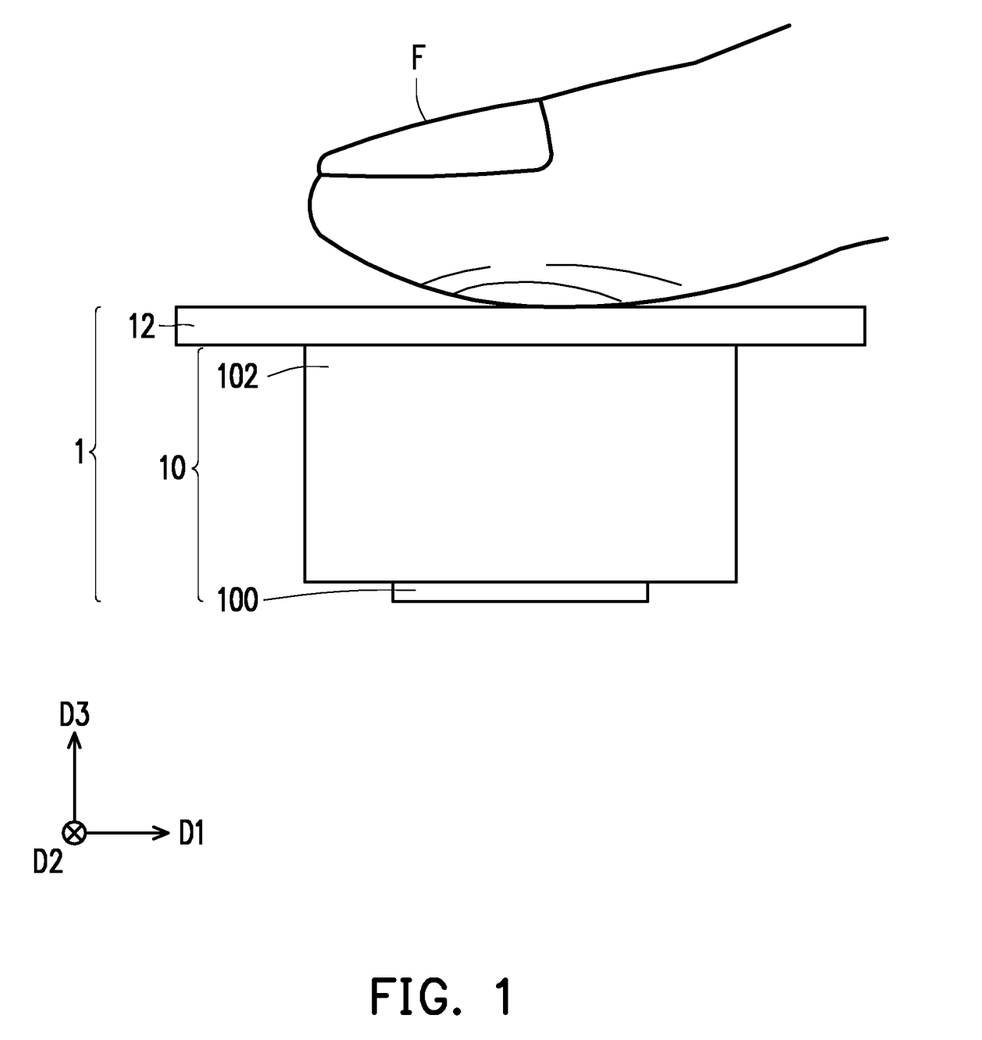
FIG. 1 is a schematic partial cross-sectional view of an image capture device according to an embodiment of the disclosure.
Figure 2:
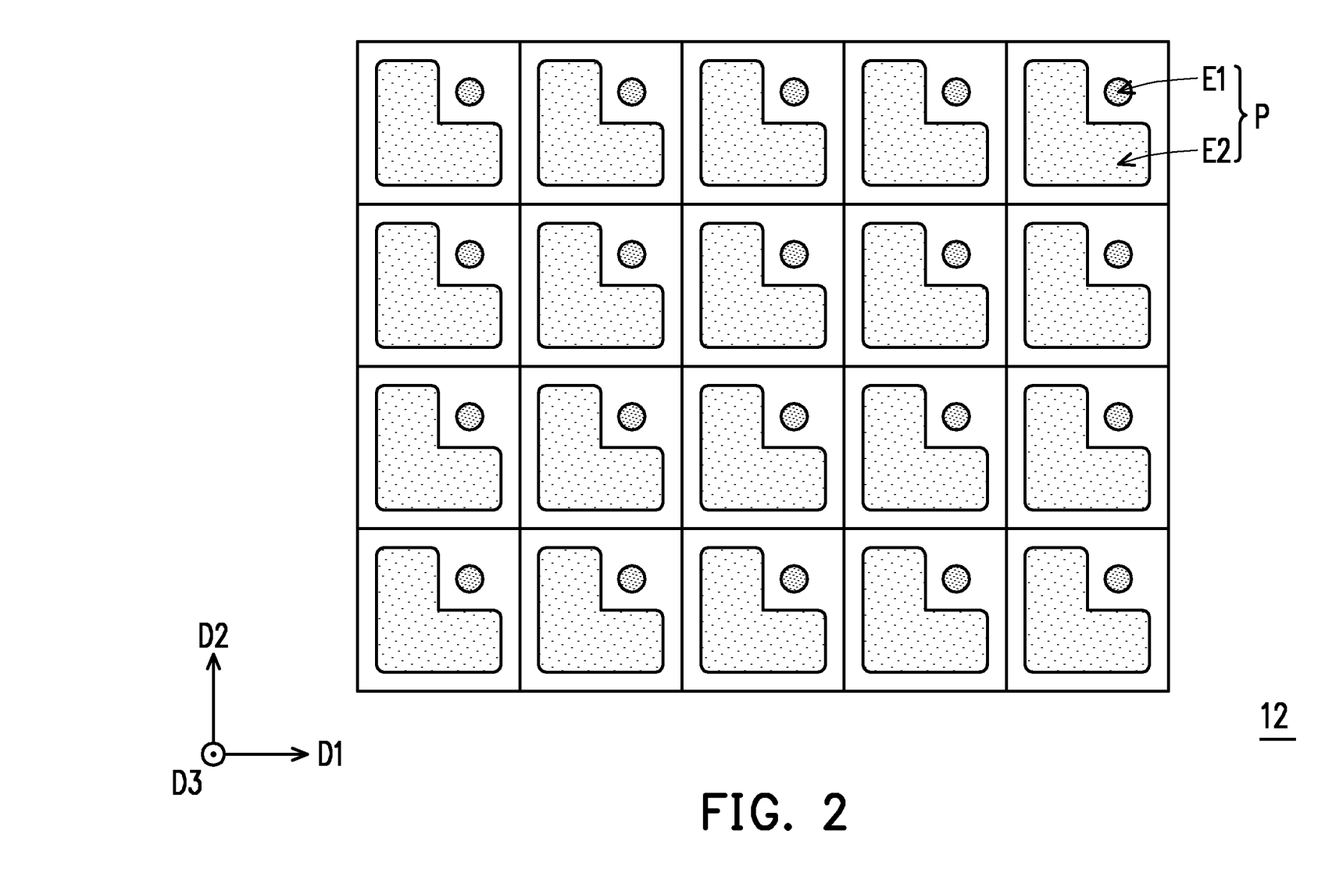
FIG. 2 is a schematic partial top view of a display panel in FIG. 1.
Figure 3:
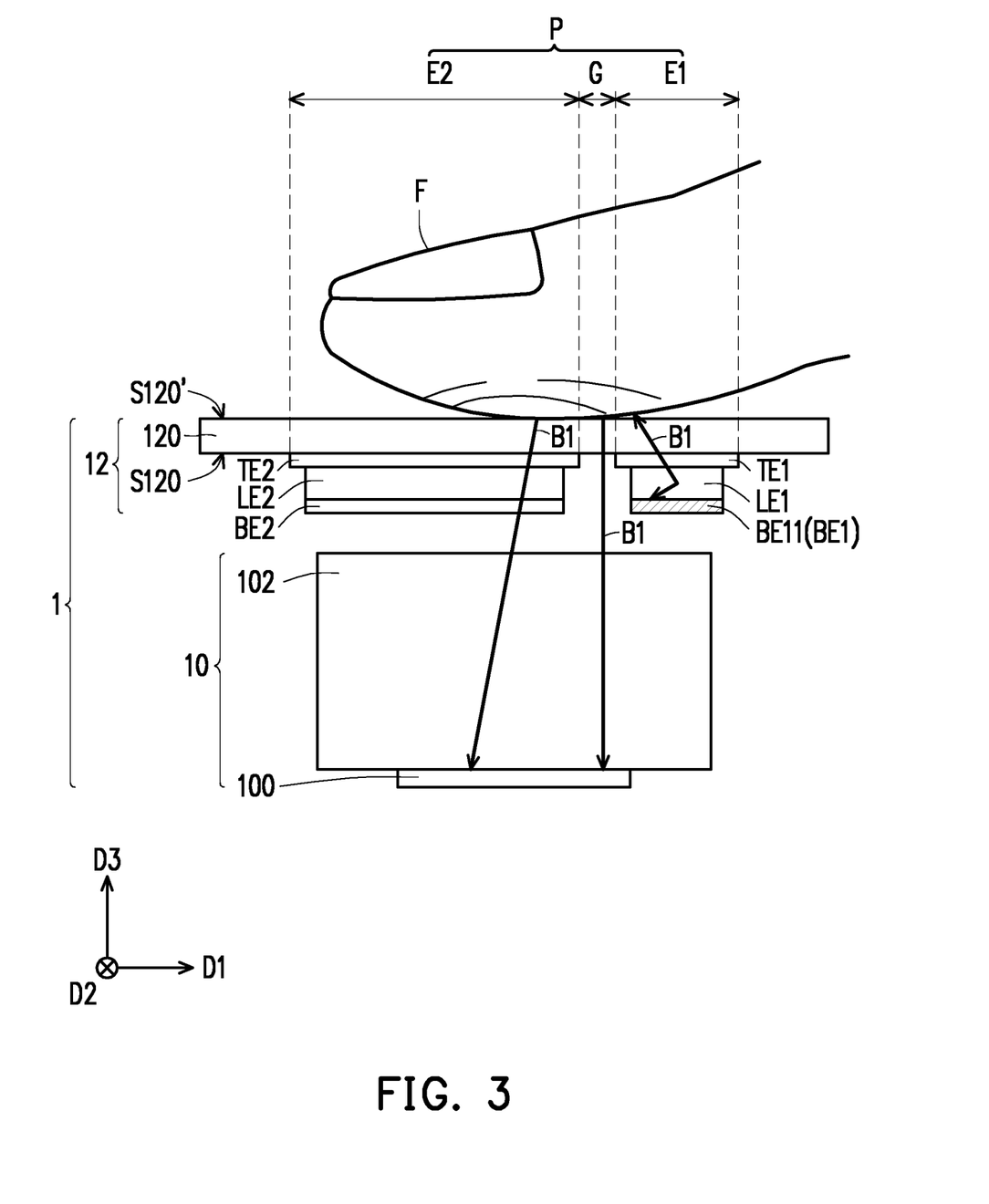
FIGS. 3 and 4 are schematic views of light paths of the image capture device of FIG. 1 respectively in an image capture mode and a display mode.
Figure 4:
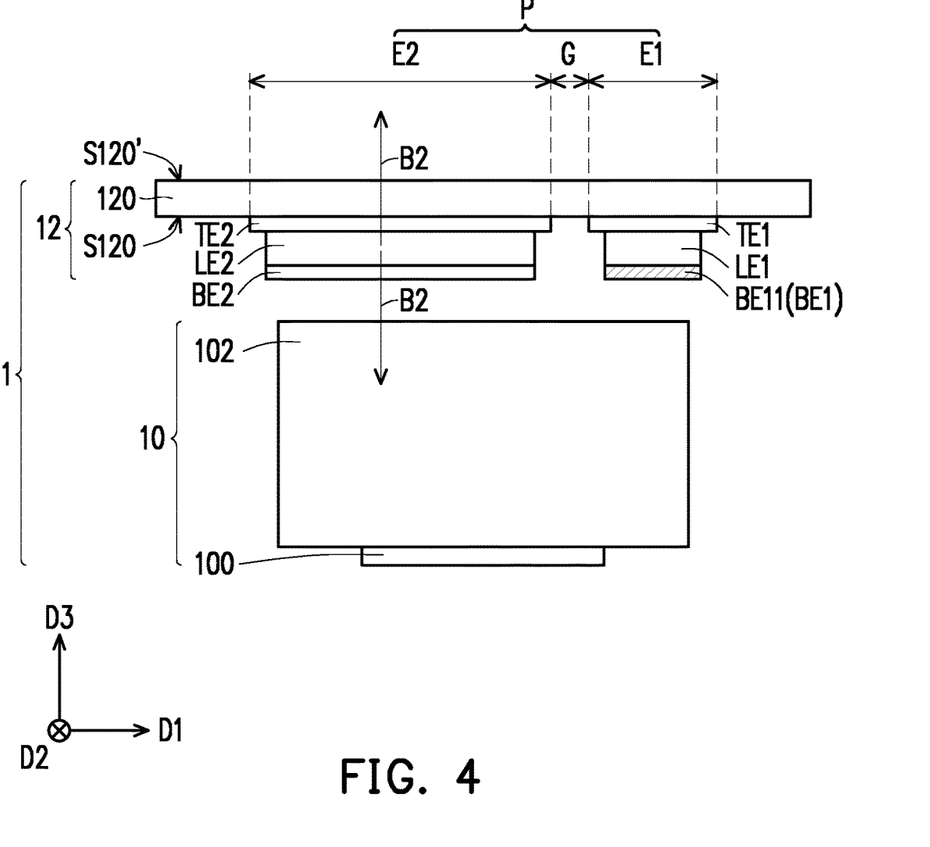
Figure 5:
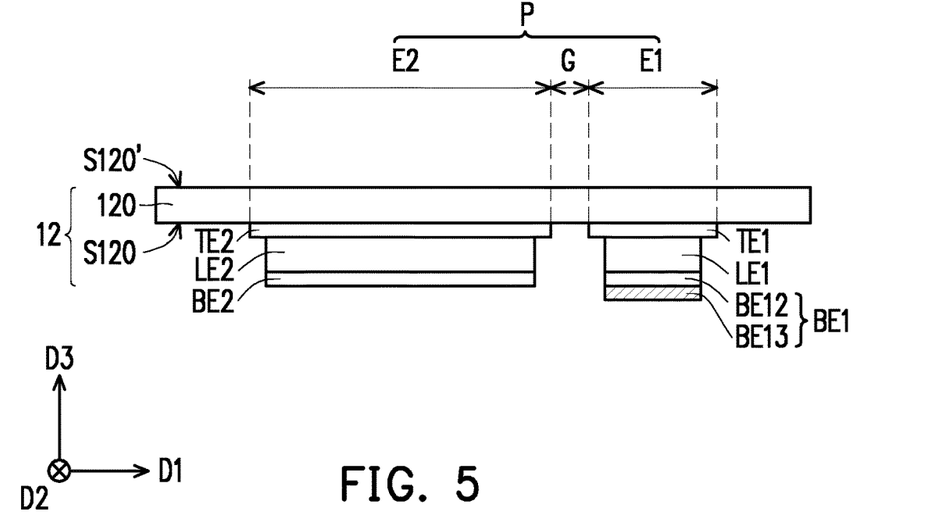
FIG. 5 is a schematic partial cross-sectional view of the display panel in FIG. 1.
Figure 6:
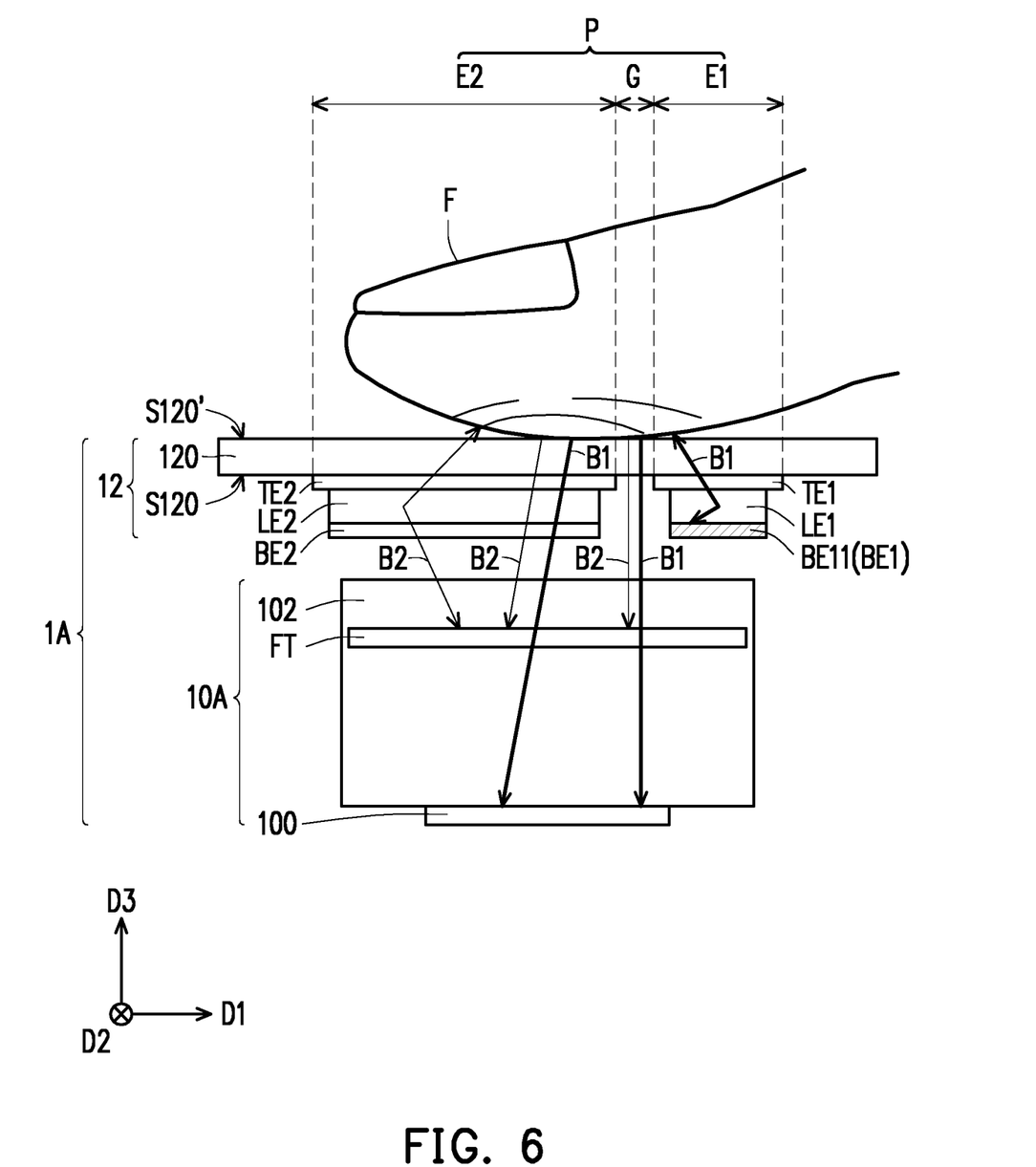
FIGS. 6 to 8 are schematic partial cross-sectional views of image capture devices according to other embodiments of the disclosure.
Figure 7:
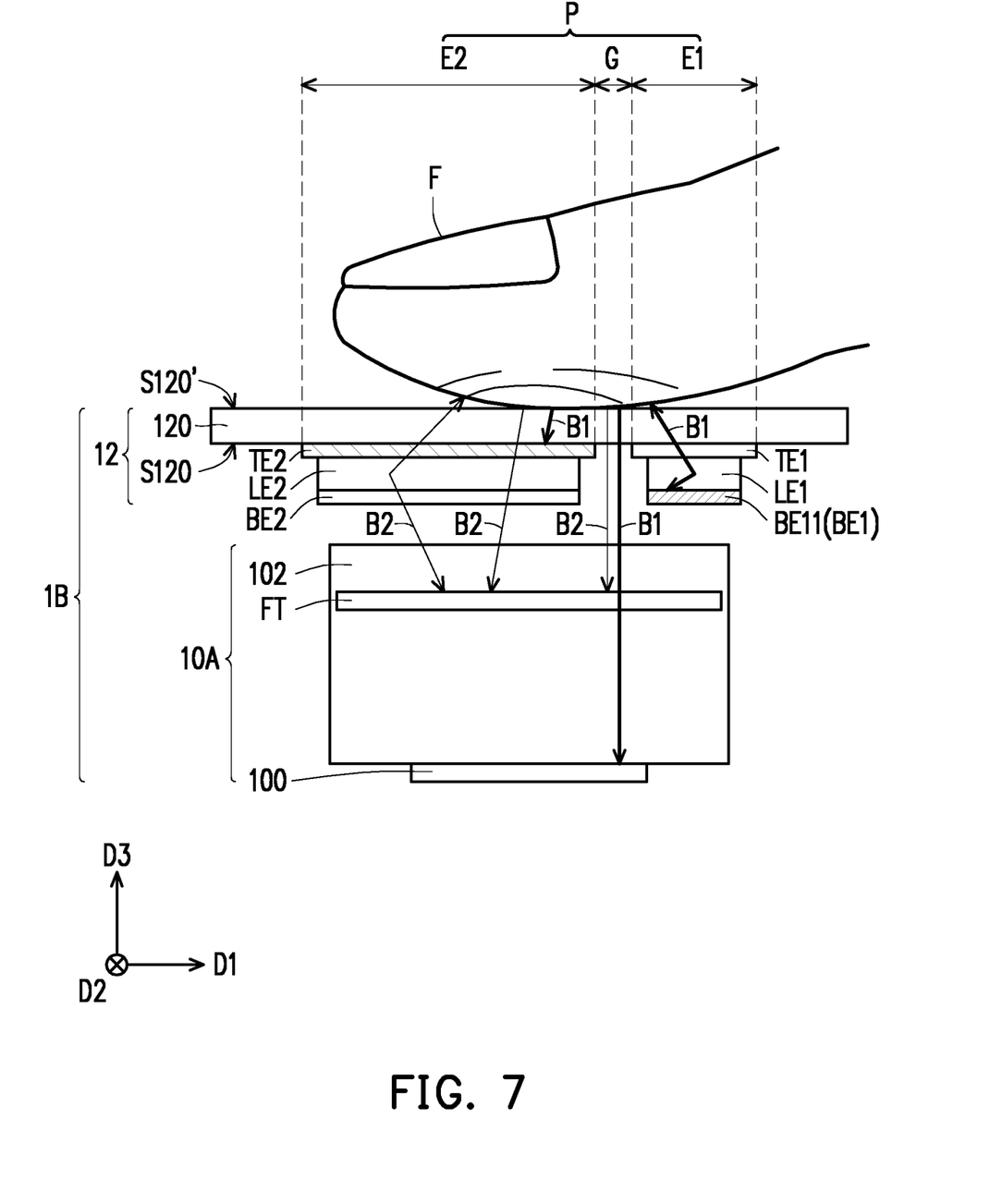
Figure 8:
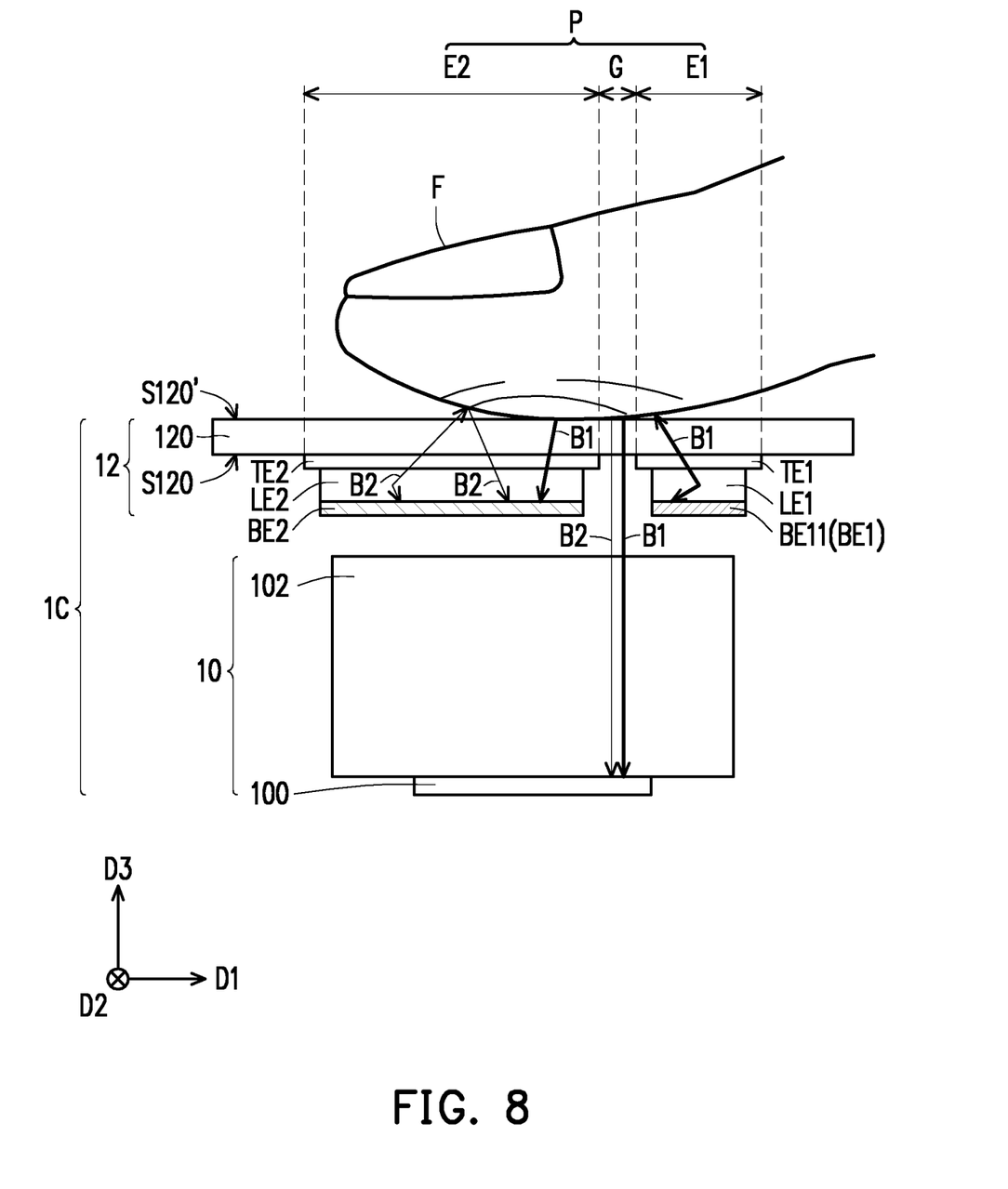
Figure 9A:
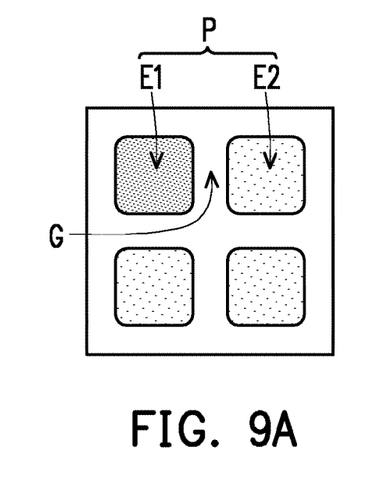
FIGS. 9A to 9H are respectively various schematic top views of pixels of the display panel.
Figure 9B:
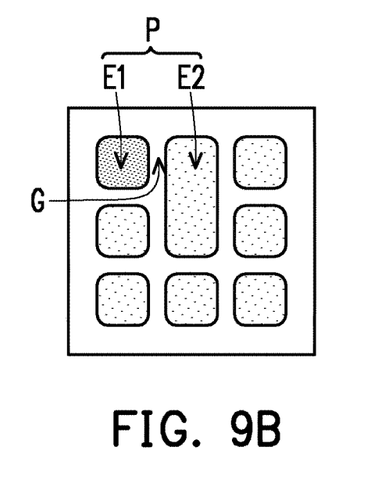
Figure 9C:
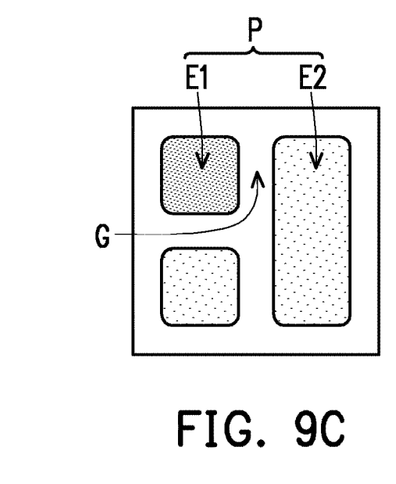
Figure 9D:
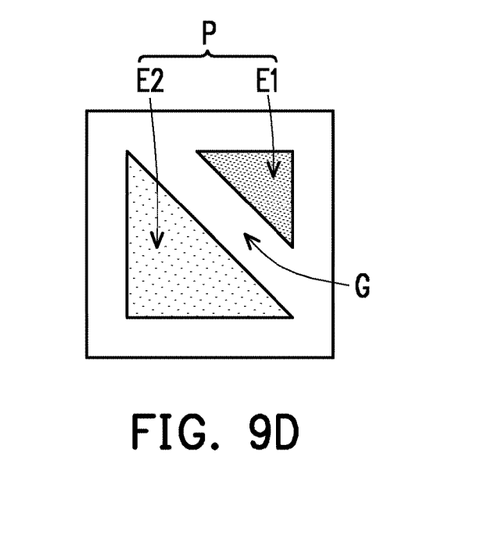
Figure 9E:
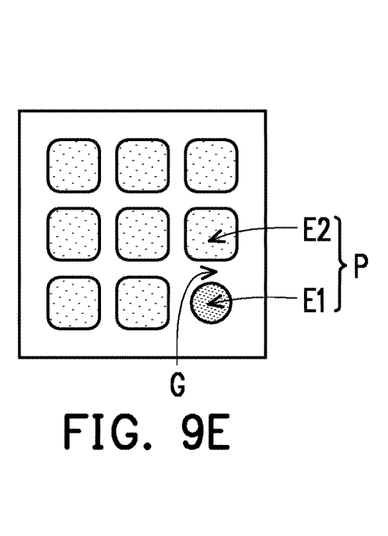
Figure 9F:
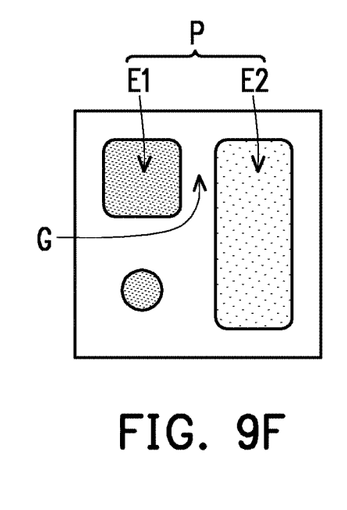
Figure 9G:
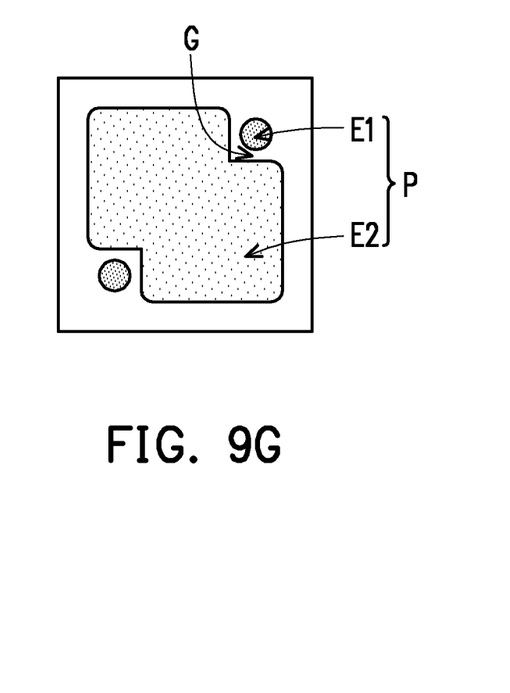
Figure 9H:
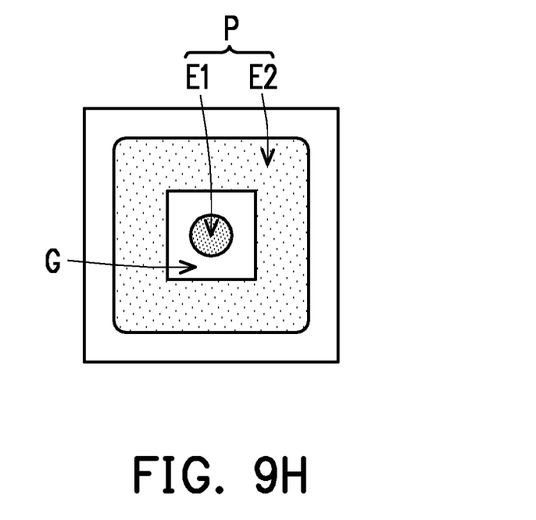
Figure 10:
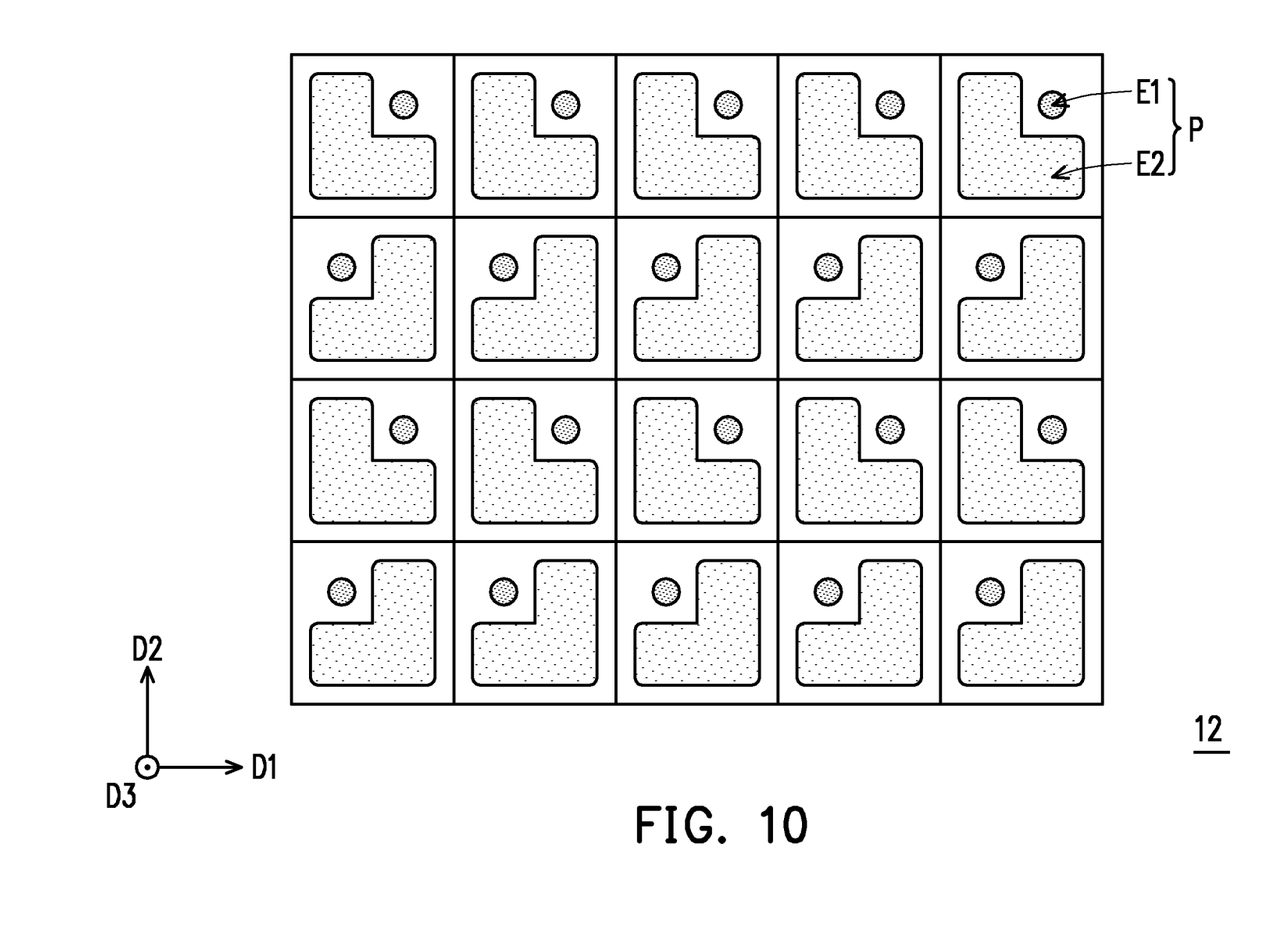
FIG. 10 is another schematic partial top view of the display panel in FIG. 1.

FIG. 1 is a schematic partial cross-sectional view of an image capture device according to an embodiment of the disclosure. FIG. 2 is a schematic partial top view of a display panel in FIG. 1. FIGS. 3 and 4 are schematic views of light paths of the image capture device of FIG. 1 respectively in an image capture mode and a display mode. FIG. 5 is a schematic partial cross-sectional view of the display panel in FIG. 1. FIGS. 6 to 8 are schematic partial cross-sectional views of image capture devices according to other embodiments of the disclosure. FIGS. 9A to 9H are respectively various schematic top views of pixels of the display panel. FIG. 10 is another schematic partial top view of the display panel in FIG. 1.

In any embodiment of the disclosure, the image capture device may be used in an environmental medium. The environmental medium may include air, water, or other types of media. The image capture device may have both a display function and an image capture function. In detail, the image capture device may be switched between a display mode and an image capture mode. When the image capture device is switched to the display mode, the image capture device may provide the display function. When the image capture device is switched to the image capture mode, the image capture device may provide the image capture function. In some embodiments, when the image capture device is switched to the image capture mode, the image capture device may further provide the display function.

When the image capture device captures an image, the image capture device is suitable for capturing an image of a biological characteristic of an object under test. For example, the object under test may be a finger, a palm, a wrist, a face, or an eyeball, and the biological characteristic may be a fingerprint, a palm print, a vein, a pupil, an iris, a facial characteristic, a heartbeat, or blood sugar. However, the disclosure is not limited thereto. For ease of description, in the following embodiment, the object under test and the biological characteristic are respectively illustrated with a finger F and the fingerprint as examples.

Referring to FIGS. 1 and 2, an image capture device 1 includes an image capture module 10 and a display panel 12. The image capture module 10 is used to capture the image of the biological characteristic (such as the fingerprint) of the object under test (such as the finger F). In some embodiments, the image capture module 10 may include a sensor 100 and an optical system 102.

The sensor 100 may include a complementary metal oxide semiconductor (CMOS) element, a charge coupled device (CCD), or other appropriate types of image sensing elements.

The optical system 102 is disposed between the sensor 100 and the display panel 12, and the optical system 102 may be used to transmit a light beam (not shown, that is, the light beam with information of the biological characteristic) reflected by the object under test (such as the finger F) to the sensor 100. In some embodiments, although not shown, the optical system 102 may include an optical lens, a micro lens matrix, or other light collimating elements. The light collimating element may be used to collimate the light beam reflected by the object under test (such as the finger F), thereby improving the crosstalk issue, so that the image capture device 1 has a good identification ability. The light collimating element may include multiple fibers, multiple pinholes, a grating, a light channel layer formed by a light-shielding layer and a light-transmitting layer, or other suitable light collimating elements.

The display panel 12 is disposed on the image capture module 10, and includes multiple pixels P. FIG. 2 schematically shows 20 pixels P, which are arranged in an array along a first direction D1 and a second direction D2. The first direction D1 and the second direction D2 are perpendicular to each other, and both the first direction D1 and the second direction D2 are perpendicular to a normal direction D3 of the display panel 12. However, it should be understood that the number or arrangement of the pixels P in the display panel 12 may be changed according to requirements, and the disclosure is not limited to what is shown in FIG. 2.

Each of the pixels P may include a first light-emitting region E1 and a second light-emitting region E2. The first light-emitting region E1 and the second light-emitting region E2 are adjacently disposed, and the first light-emitting region E1 and the second light-emitting region E2 do not overlap in the normal direction D3 of the display panel 12. FIG. 2 schematically shows that each of the pixels P includes one first light-emitting region E1 and one second light-emitting region E2. Top-view shapes of the first light-emitting region E1 and the second light-emitting region E2 are respectively circular and L-shaped, and the first light-emitting region E1 is located at an upper right corner of the second light-emitting region E2. However, it should be understood that the respective numbers, top-view shapes, and sizes of the first light-emitting region E1 and the second light-emitting region E2 in each of the pixels P, or a relative disposing relation between the first light-emitting region E1 and the second light-emitting region E2 may be changed according to the requirements. The disclosure is not limited to what is shown in FIG. 2.

The first light-emitting region E1 is, for example, an image capture light-emitting region, and the second light-emitting region E2 is, for example, a display light-emitting region. In other words, the first light-emitting region E1 emits a light beam (not shown, hereinafter for ease of description, the light beam emitted by the first light-emitting region E1 is referred to as a first light beam) at least when the image capture device 1 is switched to the image capture mode, so as to provide the light beam that illuminates the object under test (such as the finger F). On the other hand, the second light-emitting region E2 emits a light beam (not shown, hereinafter for ease of description, the light beam emitted by the second light-emitting region E2 is referred to as a second light beam) at least when the image capture device 1 is switched to the display mode, so as to provide an image. According to the verification, in each of the pixels P, if a total area of the first light-emitting region (the image capture light-emitting region) is smaller than a total area of the second light-emitting region (the display light-emitting region), the image capture module 10 may easily identify the biological characteristic. If the total area of the first light-emitting region (the image capture light-emitting region) is equal to the total area of the second light-emitting region (the display light-emitting region), the image capture module 10 may barely identify the biological characteristic. If the total area of the first light-emitting region (the image capture light-emitting region) is greater than the total area of the second light-emitting region (the display light-emitting region), the image capture module 10 is difficult to identify the biological characteristic. Therefore, by making the total area of the first light-emitting region E1 (such as the image capture light-emitting region) in each of the pixels P smaller than the total area of the second light-emitting region E2 (such as the display light-emitting region), an image capturing quality of the image capture module 10 may be maintained.

According to different designs, the first light-emitting region E1 and the second light-emitting region E2 may emit the light beams at the same time, or the first light-emitting region E1 and the second light-emitting region E2 may not emit the light beams at the same time. In addition, the first light beam and the second light beam may have the same wavelengths, or the first light beam and the second light beam may have different wavelengths.

FIGS. 3 and 4 show an embodiment in which the first light-emitting region E1 and the second light-emitting region E2 do not emit the light beams at the same time. In FIGS. 3 and 4, the display panel 12 is illustrated with a passive matrix organic light-emitting diode display panel as an example, but the type of the display panel 12 is not limited thereto. For the sake of brevity, only one pixel P in the display panel 12 is schematically shown in FIGS. 3 and 4.

The display panel 12 may include, for example, a substrate 120. The substrate 120 may be used to carry an element, and may serve as a protective cover. For example, the substrate 120 may be a glass substrate, but is not limited thereto.

The first light-emitting region E1 may include a first upper electrode TE1, a first light-emitting layer LE1, and a first lower electrode BE1. The first light-emitting layer LE1 is located between the first upper electrode TE1 and the first lower electrode BE1, and the first upper electrode TE1, the first light-emitting layer LE1, and the first lower electrode BE1 are, for example, sequentially formed on an inner surface S120 of the substrate 120. The first upper electrode TE1 may allow a first light beam B1 to pass through, and the first lower electrode BE1 may shield the first light beam B1. For example, the first upper electrode TE1 may include a transparent conductive electrode or a conductive electrode that the first light beam B1 may penetrate, and the first lower electrode BE1 may include a non-transparent conductive electrode BE11. In addition, as shown in FIG. 5, the first lower electrode BE1 may include a transparent conductive electrode BE12 and a stacked layer of a light-shielding layer BE13. The transparent conductive electrode BE12 is located between the first light-emitting layer LE1 and the light-shielding layer BE13. The light-shielding layer BE13 may be a light-absorbing layer or a light-reflecting layer. By a design that the first lower electrode BE1 shields the first light beam B1, a negative impact (such as the difficulty in identification caused by the overexposure of the image) on the image capturing quality due to a direct light from the first light-emitting layer LE1 to the image capture module 10 may be improved.

The second light-emitting region E2 may include a second upper electrode TE2, a second light-emitting layer LE2, and a second lower electrode BE2. The second light-emitting layer LE2 is located between the second upper electrode TE2 and the second lower electrode BE2, and the second upper electrode TE2, the second light-emitting layer LE2, and the second lower electrode BE2 are, for example, sequentially formed on the inner surface S120 of the substrate 120. Both the second upper electrode TE2 and the second lower electrode BE2 may allow the first light beam B1 to pass through. For example, the second upper electrode TE2 and the second lower electrode BE2 may include the transparent conductive electrode or the conductive electrode that the first light beam B1 may penetrate. By a design that both the second upper electrode TE2 and the second lower electrode BE2 may allow the first light beam B1 to pass through, the first light beam B1 reflected by the finger F not only may be transmitted to the image capture module 10 from a gap G between the first light-emitting region E1 and the second light-emitting region E2, but also may pass through the second light-emitting region E2 to be transmitted to the image capture module 10.

When the image capture device 1 is switched to the image capture mode, as shown in FIG. 3, the first light-emitting region E1 emits the first light beam B1, and the second light-emitting region E2 does not emit the light beam. Specifically, a voltage may be applied to the first upper electrode TE1 and the first lower electrode BE1, so that the first light-emitting layer LE1 emits the first light beam B1. The first light beam B1 is transmitted to the finger F and then reflected by the finger F. The first light beam B1 reflected by the finger F may be transmitted to the image capture module 10 through a region outside the first light-emitting region E1 (such as the second light-emitting region E2 and the gap G located between the first light-emitting region E1 and the second light-emitting region E2).

When the image capture device 1 is switched to the display mode, as shown in FIG. 4, the second light-emitting region E2 emits the second light beam B2, and the first light-emitting region E1 does not emit the light beam. Specifically, the voltage may be applied to the second upper electrode TE2 and the second lower electrode BE2, so that the second light-emitting layer LE2 emits the second light beam B2. In the second light-emitting region E2, at least the second upper electrode TE2 may allow the second light beam B2 to pass through, so that a user (not shown) may see the image from an outer surface S120' of the display panel 12. In some embodiments, as shown in FIG. 4, both the second upper electrode TE2 and the second lower electrode BE2 may allow the second light beam B2 to pass through, but the disclosure is not limited thereto.

In the embodiment of FIGS. 3 and 4, the first light beam B1 and the second light beam B2 may have the same wavelengths or different wavelengths. For example, the first light beam B1 and the second light beam B2 may both be visible lights. In addition, the first light beam B1 may be an invisible light, and the second light beam B2 may be the visible light. The invisible light may include an infrared light, but is not limited thereto.

Under the framework that the first light beam B1 and the second light beam B2 have the same wavelengths, although not shown, the second lower electrode BE2 may also be changed to an electrode that shields the first light beam B1 and the second light beam B2. In this way, the first light beam B1 reflected by the finger F is transmitted to the image capture module 10 through the gap G between the first light-emitting region E1 and the second light-emitting region E2 (or the region outside the first light-emitting region E1 and the second light-emitting region E2). On the other hand, under the framework that the first light beam B1 and the second light beam B2 have the different wavelengths, although not shown, at least one of the second upper electrode TE2 and the second lower electrode BE2 may be changed to allow the second light beam B2 to pass through and shield the first light beam B1. In this way, the first light beam B1 reflected by the finger F is also transmitted to the image capture module 10 through the gap G between the first light-emitting region E1 and the second light-emitting region E2 (or the region outside the first light-emitting region E1 and the second light-emitting region E2).

By dividing one single pixel P into multiple light-emitting regions (such as the first light-emitting region E1 and the second light-emitting region E2), the same set of electrodes may correspond to the light-emitting regions, thereby achieving an effect of improving the resolution, so that the image capture device 1 may have higher resolution than a conventional passive matrix organic light-emitting diode display panel. In addition, by making the total area of the first light-emitting region E1 (such as the image capture light-emitting region) in each of the pixels P smaller than the total area of the second light-emitting region E2 (such as the display light-emitting region), it is beneficial to maintain the image capturing quality of the image capture module 10.

Referring to FIG. 6, the main difference between an image capture device 1A and the image capture device 1 of FIGS. 3 and 4 is described as follows. In the image capture device 1A, the second light-emitting region E2 emits the second light beam B2 when the first light-emitting region E1 emits the first light beam B1. For example, when the image capture device 1A is switched to the image capture mode, the first light-emitting region E1 emits the first light beam B1 to illuminate the object under test (such as the finger F). At the same time, the second light-emitting region E2 emits the second light beam B2 to provide the image. That is, the image capture device 1A may provide the image capture function and the display function at the same time.

Under the framework of FIG. 6, the second light beam B2 and the first light beam B1 have, for example, the different wavelengths. For example, the first light beam B1 may be the invisible light, and the second light beam B2 may be the visible light. An image capture module 10A may include a filter FT. The filter FT may be disposed in the optical system 102, but is not limited thereto. In other embodiments, the filter FT may be disposed between the optical system 102 and the display panel 12 or between the optical system 102 and the sensor 100. The filter FT may allow the first light beam B1 to pass through and filter the second light beam B2. In this way, an interference of the second light beam B2 with a sensing result may be reduced.

Referring to FIG. 7, the main difference between an image capture device 1B and the image capture device 1A of FIG. 6 is described as follows. In the image capture device 1B, the second upper electrode TE2 allows the second light beam B2 to pass through and shields the first light beam B1. For example, the second upper electrode TE2 may be formed by a material that allows the visible light to pass through and shields the infrared light. In other embodiments, although not shown, the second lower electrode BE2 may be changed to an electrode that allows the second light beam B2 to pass through and shields the first light beam B1. In addition, both the second upper electrode TE2 and the second lower electrode BE2 may be the electrodes that allow the second light beam B2 to pass through and shield the first light beam B1. In other words, the first light beam B1 may be shielded by at least one of the second upper electrode TE2 and the second lower electrode BE2. Under such design, the first light beam B1 reflected by the finger F is, for example, transmitted to the image capture module 10A through the gap G between the first light-emitting region E1 and the second light-emitting region E2 (or the region outside the first light-emitting region E1 and the second light-emitting region E2).

Referring to FIG. 8, the main difference between an image capture device 1C and the image capture device 1A of FIG. 6 is described as follows. In the image capture device 1C, the second light beam B2 and the first light beam B1 have, for example, the same wavelengths. For example, the second light beam B2 and the first light beam B1 may both be the visible lights. Under the framework that the second light beam B2 and the first light beam B1 have the same wavelengths, the filter FT may be omitted in the image capture module 10. In addition, the second lower electrode BE2 is, for example, the electrode that shields the first light beam B1 and the second light beam B2. By a design that the second lower electrode BE2 shields the second light beam B2, the negative impact (such as the difficulty in identification caused by the overexposure of the image) on the image capturing quality due to a direct light from the second light-emitting layer LE2 to the image capture module 10 may be improved. Under such design, the first light beam B1 and the second light beam B2 reflected by the finger F are, for example, transmitted to the image capture module 10 through the gap G between the first light-emitting region E1 and the second light-emitting region E2 (or the region outside the first light-emitting region E1 and the second light-emitting region E2).

Referring to FIGS. 9A to 9H, according to the different designs or requirements, the respective numbers of the first light-emitting regions E1 and the second light-emitting regions E2 in each of the pixels P may be one or more. In addition, the respective top-view shapes of the first light-emitting region E1 and the second light-emitting region E2 may be a square, a circle, a triangle, other polygons, or a combination of the above. In addition, the respective areas or sizes of the first light-emitting region E1 and the second light-emitting region E2 may be adjusted according to the requirements.

Referring to FIG. 10, according to the different designs or requirements, the pixels P in two adjacent horizontal rows in the second direction D2 may have left-and-right reversed dispositions, and the pixels P in the same row may have the same dispositions (which refers to the relative disposing relationship between the first light-emitting region E1 and the second light-emitting region E2). For example, in FIG. 10, the five pixels P arranged in the first direction D1 is called a horizontal row, and the four horizontal rows from the top to the bottom are respectively called the first horizontal row, the second horizontal row, the third horizontal row, and the fourth horizontal row. The pixels P in the two adjacent horizontal rows (such as the first horizontal row and the second horizontal row, the second horizontal row and the third horizontal row, or the third horizontal row and the fourth horizontal row) have the left-and-right reversed dispositions, and the five pixels P in the same row have the same dispositions. In other embodiments, although not shown, the pixels in the two adjacent horizontal rows in the second direction D2 may have upside-down dispositions, and the pixels in the same horizontal row may have the same dispositions. One of the first direction D1 and the second direction D2 may be a direction parallel to a short side of the display panel 12, and the other of the first direction D1 and the second direction D2 may be a direction parallel to a long side of the display panel 12. However, the disclosure is not limited thereto.

Based on the above, in the embodiment of the disclosure, since the single pixel is divided into the light-emitting regions, the image capture device may have higher resolution than the conventional passive matrix organic light-emitting diode display panel. In addition, by making the total area of the first light-emitting region (such as the image capture light-emitting region) in each of the pixels smaller than the total area of the second light-emitting region (such the display light-emitting region), it is beneficial to maintain the image capturing quality of the image capture module. In some embodiments, by adjusting the sizes, shapes (top-view shapes), or numbers of the light-emitting regions, the resolution or optical transmittance of the image capture device may be improved. In some embodiments, a size of the display panel 12 is not limited, as long as the size of the display panel 12 is greater than a size of the image capture module 10. In some embodiments, an application of the image capture device is not limited. For example, the image capture device may be applied to the mobile payment, home security, or collection of art exhibits, etc.

What is claimed is:
1. An image capture device, comprising:
an image capture module; and
a display panel disposed on the image capture module and comprising a plurality of pixels, wherein each of the plurality of pixels comprises both a first light-emitting region and a second light-emitting region, the first light-emitting region emits a first light beam, the second light-emitting region emits a second light beam, the first light beam is transferred to the image capture module through a region outside the first light-emitting region, and in each of the plurality of pixels, a total area of the first light-emitting region is smaller than a total area of the second light-emitting region,
wherein the second light-emitting region does not emit the second light beam when the first light-emitting region emits the first light beam.

2. The image capture device according to claim 1, wherein the image capture module comprises:
a sensor; and
an optical system disposed between the sensor and the display panel.

3. The image capture device according to claim 2, wherein the optical system comprises an optical lens or a micro lens matrix.

4. The image capture device according to claim 1, wherein the first light-emitting region comprises a first upper electrode, a first light-emitting layer, and a first lower electrode, the first light-emitting layer is located between the first upper electrode and the first lower electrode, the first upper electrode allows the first light beam to pass through, and the first lower electrode shields the first light beam.

5. The image capture device according to claim 4, wherein the first lower electrode comprises a non-transparent conductive electrode, or the first lower electrode comprises a transparent conductive electrode and a stacked layer of a light-shielding layer.

6. The image capture device according to claim 1, wherein the second light beam and the first light beam have different wavelengths, the image capture module comprises a filter, and the filter allows the first light beam to pass through and filters the second light beam.

7. The image capture device according to claim 6, wherein the second light-emitting region comprises a second upper electrode, a second light-emitting layer, and a second lower electrode, the second light-emitting layer is located between the second upper electrode and the second lower electrode, both the second upper electrode and the second lower electrode allow the second light beam to pass through, and at least one of the second upper electrode and the second lower electrode shields the first light beam.

8. The image capture device according to claim 1, wherein the second light beam and the first light beam have same wavelengths, the second light-emitting region comprises a second upper electrode, a second light-emitting layer, and a second lower electrode, the second light-emitting layer is located between the second upper electrode and the second lower electrode, the second upper electrode allows the first light beam and the second light beam to pass through, and the second lower electrode shields the first light beam and the second light beam.

* * * * *